US009431081B2

(12) United States Patent
Jang et al.

(10) Patent No.: US 9,431,081 B2
(45) Date of Patent: Aug. 30, 2016

(54) MEMORY DEVICE (71) Applicant: SK hynix Inc., Gyeonggi-do (KR)

(72) Inventors: Soo-Young Jang, Gyeonggi-do (KR); Hyun-Woo Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 7 days.

(21) Appl. No.: 14/558,349

(22) Filed: Dec. 2, 2014

(65) Prior Publication Data

US 2016/0019940 A1    Jan. 21, 2016

(30) Foreign Application Priority Data

Jul. 21, 2014    (KR) .................. 10-2014-0091928

(51) Int. Cl.
*G11C 7/06*    (2006.01)
*G11C 8/08*    (2006.01)
*G11C 29/00*    (2006.01)
*G11C 11/401*    (2006.01)
*G11C 29/12*    (2006.01)

(52) U.S. Cl.
CPC .................. *G11C 8/08* (2013.01); *G11C 29/76* (2013.01); *G11C 11/401* (2013.01); *G11C 2029/1202* (2013.01)

(58) Field of Classification Search
CPC ........... G11C 8/08; G11C 8/14; G11C 29/04; G11C 29/52; G11C 29/76
USPC ................................................... 365/189.07
See application file for complete search history.

(56) References Cited

U.S. PATENT DOCUMENTS

| | | | | | |
|---|---|---|---|---|---|
| 5,652,725 | A | * | 7/1997 | Suma ..................... | G11C 29/24 365/200 |
| 2006/0233014 | A1 | * | 10/2006 | Oh ........................ | G11C 29/808 365/154 |
| 2009/0116318 | A1 | * | 5/2009 | Kuroda .................... | G11C 7/08 365/200 |
| 2009/0201730 | A1 | * | 8/2009 | Lueng ................... | G11C 11/404 365/185.08 |
| 2013/0262740 | A1 | * | 10/2013 | Kim ..................... | G06F 12/0246 711/102 |
| 2013/0336076 | A1 | * | 12/2013 | Jeong .................... | G11C 29/04 365/200 |
| 2014/0003173 | A1 | * | 1/2014 | Ku ........................ | G11C 29/04 365/200 |
| 2015/0340077 | A1 | * | 11/2015 | Akamatsu .............. | G11C 29/78 365/96 |
| 2016/0005452 | A1 | * | 1/2016 | Bae ....................... | G11C 11/406 714/764 |

FOREIGN PATENT DOCUMENTS

| | | |
|---|---|---|
| KR | 1020130111074 | 10/2013 |
| KR | 1020140002928 | 1/2014 |
| KR | 1020140043560 | 4/2014 |

* cited by examiner

*Primary Examiner* — Toan Le
(74) *Attorney, Agent, or Firm* — IP & T Group LLP (57) ABSTRACT

A memory device includes a plurality of normal word lines arranged at a first distance from each other, a redundant word line arranged at a second distance, which is greater than the first distance from a normal word line adjacent to the redundant word line, among the normal word lines, and a word line control unit suitable for selectively activating the normal word lines, and replacing a frequently activated word line with the redundant word line when the frequently activated word line is detected.

23 Claims, 9 Drawing Sheets

MEMORY DEVICE

CROSS-REFERENCE TO RELATED APPLICATIONS

The present application claims priority of Korean Patent Application No. 10-2014-0091928, filed on Jul. 21, 2014, which is incorporated herein by reference in its entirety.

BACKGROUND

1. Field

Various embodiments of the present invention relate to a memory device.

2. Description of the Related Art

A memory device includes a plurality of memory cells. A memory cell may include a transistor serving as a switch and a capacitor for storing electric charges that correspond to data. Data stored in the capacitor of the memory cell is determined according to an amount of electric charges charged in the capacitor. When the charge amount is large enough, the corresponding memory cell is determined to store high data (logic 1). When the electric charges are discharged, the corresponding memory cell is determined to store low data (logic 0).

Since data is retained in such a form that electric charges are accumulated in the capacitor, in principle no power is consumed. However, since the initial electric charges stored in the capacitor disappear due to leakage current caused by a PN junction of a MOS transistor or the like, the data may be lost. To prevent such a data loss, the data stored in the memory cell is to be read before the data is lost, and the capacitor is to be recharged according to the read information. Such a recharging operation, which is referred to as a refresh operation, needs to be periodically repeated to retain the data.

Figure 1:
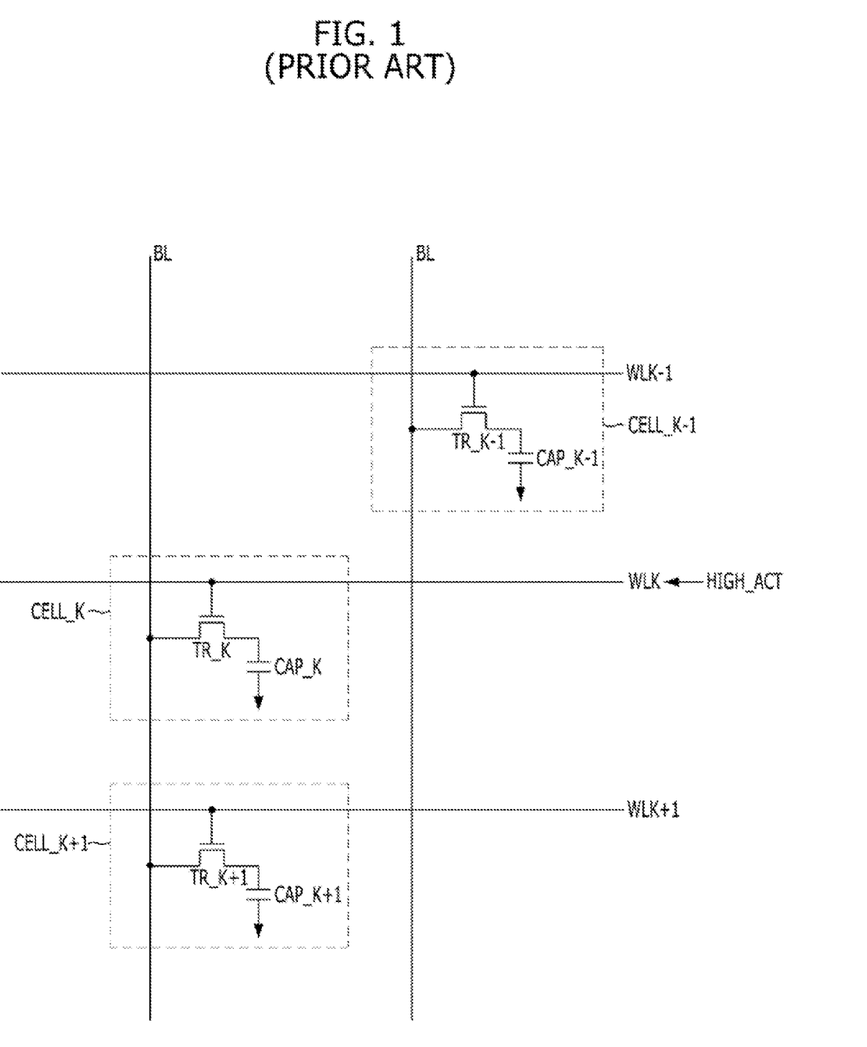
FIG. 1 is a diagram illustrating a cell array included in a memory device.

FIG. 1 is a diagram illustrating a cell array included in a memory device. In FIG. 1, "BL"S represent bit lines, In the cell array of FIG. 1, WLK−1, WLK, and WLK+1 represent three word lines successively arranged in parallel to each other. Furthermore, WLK with HIGH_ACT represents a frequently activated word line of which the number of activations or active frequency is high, and WLK−1 and WLK+1 represent adjacent word lines arranged adjacent to the word line WLK. Furthermore, CELL_K−1, CELL_K, and CELL_K+1 represent memory cells coupled to the word lines WLK−1, WLK, and WLK+1, respectively. The memory cells CELL_K−1 CELL_K, and CELL_K+1 include cell transistors TR_K−1, TR_K, and TR_K+1 and cell capacitors CAP_K−1, CAP_K, and CAP_K+1, respectively.

In FIG. 1, when the word line WLK is activated, or precharged, that is, deactivated, the voltage of the word lines WLK−1 and WLK+1 increase or decrease due to coupling, which occurs between the word line WLK and the word lines WLK−1 and WLK+1, thereby affecting an amount of electric charges charged in the cell capacitors CAP_K−1 and CAP_K+1. Thus, when the word line WOK is frequently activated and precharged to toggle between an active state and a precharge state, data stored in the memory cells CELL_K−1 and CELL_ +1 may be lost due to the change of the amount of electric charges charged in the cell capacitors CAP_K−1 and CAP_K+1.

Furthermore, electromagnetic waves generated while a word line toggles between the active state and the precharge state may transfer electric charges, for example, electrons, of cell capacitors coupled to adjacent word lines, thereby degrading the data of the memory cell. Such a phenomenon is referred to as word line disturbance or row hammering.

SUMMARY

Various embodiments of the present invention are directed to a memory device that may replace a frequently activated word line with a word line having relatively strong immunity to word line disturbance.

In an embodiment of the present invention, a memory device may include: a plurality of normal word lines arranged at a first distance from each other; a redundant word line arranged at a second distance, which is greater than the first distance from a normal word line adjacent to the redundant word line among the normal word lines; and a word line control unit suitable for selectively activating the normal word lines and replacing a frequently activated word line with the redundant word line, when the frequently activated word line is detected among the normal word lines. The word line control unit may include: detector suitable for detecting the frequently activated word line; a comparator suitable for storing an address of the frequently activated word line when the frequently activated word line is detected, and comparing a currently inputted address with the stored address; and a word line controller suitable for activating a word line corresponding to the currently inputted address based on an active command, and activating the redundant word line in a state where the frequently activated word line is activated when the frequently activated word line is detected.

In an embodiment of the present invention, a memory device may include: a plurality of normal word lines; a redundant word line; a dummy word line arranged between the redundant word line and a normal word line adjacent to the redundant word line, among the normal word lines; and a word line control unit suitable for selectively activating the normal word lines, and replacing a frequently activated word line with the redundant word line, when the frequently activated word line is detected among the normal word lines.

In an embodiment of the present invention, a memory device may include: a plurality of normal word lines; a redundant word line; and a word line control unit suitable for selectively activating the normal word lines, and replacing a frequently activated word line with the redundant word line when the frequently activated word line is detected among the normal word lines.

The memory cell may include: a switching transistor coupled to a corresponding word line; and a cell capacitor coupled to the switching transistor, and the switching transistor of a memory cell coupled to the normal word line adjacent to the redundant word line may have a higher threshold voltage than the switching transistor of a memory cell coupled to a normal word line which is not adjacent to the redundant word line.

The memory cell may include: a switching transistor coupled to a corresponding word line; and a cell capacitor coupled to the switching transistor, and the cell capacitor of a memory cell coupled to the normal word line adjacent to the redundant word line may have a greater capacitance than the cell capacitor of a memory cell coupled to a normal word line which is not adjacent to the redundant word line.

DETAILED DESCRIPTION

Various embodiments will be described below in more detail with reference to the accompanying drawings. The present invention in may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to the first layer being formed directly on the second layer or the substrate but also when a third layer exists between the first layer and the second layer or the substrate.

Figure 2:
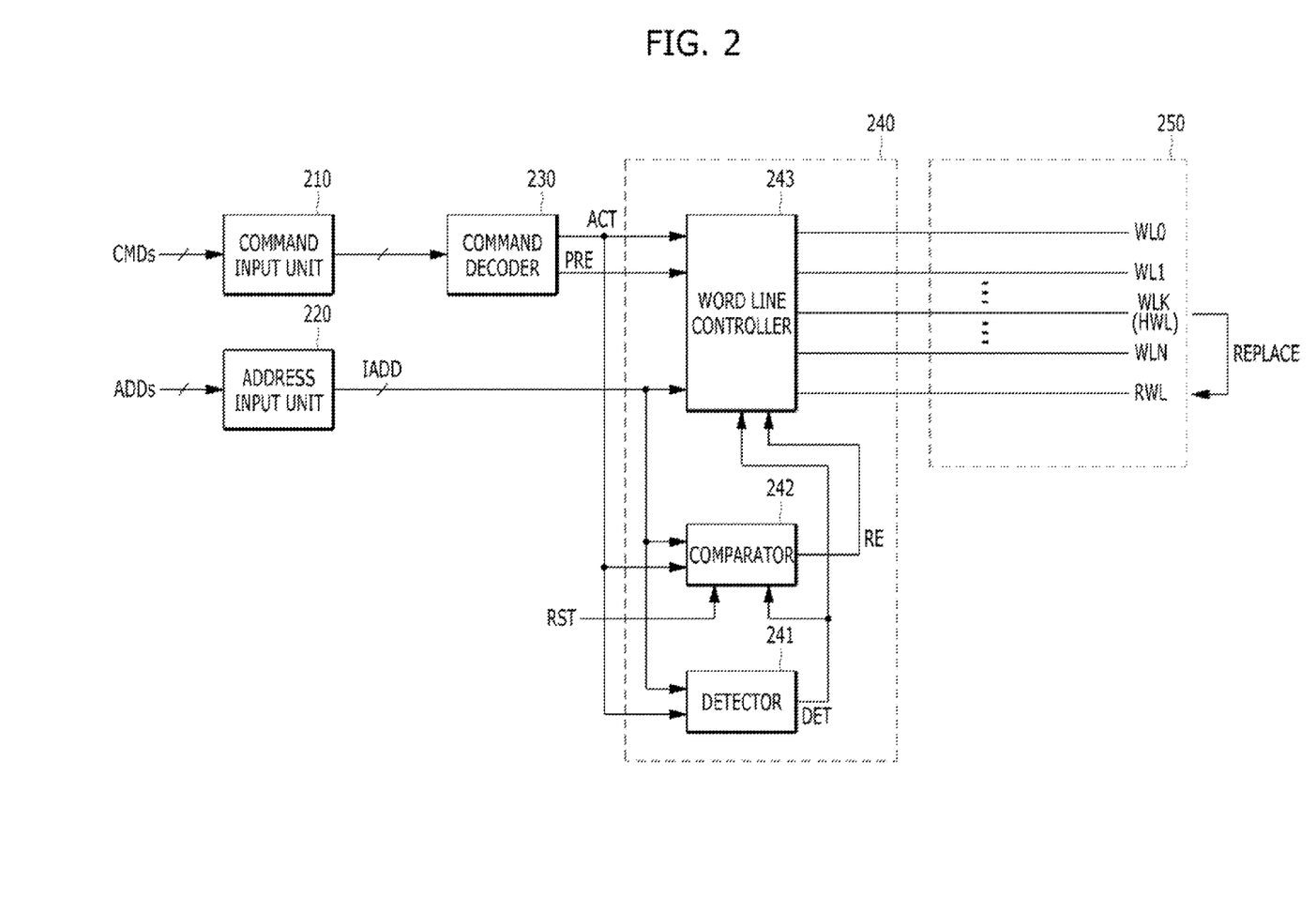
FIG. 2 is a diagram illustrating a memory device in accordance with an embodiment of the present invention.

FIG. 2 is a diagram illustrating a memory device in accordance with an embodiment of the present invention.

Referring to FIG. 2, the memory device may include a command input unit 210, an address input unit 220, a command decoder 230, a word line control unit 240, and a cell array 250. The cell array 250 may include a plurality of normal word lines WL0 to WLN and at least one redundant word line RWL.

The command input unit 210 may receive command signals CMDs, and the address input unit 220 may receive address signals ADDS. Each of the commands CMDs and the address signals ADDs may include multi-bit signals.

The command decoder 230 may decode the command signals inputted through the command input unit 210, and generate an active command ACT and a precharge command PRE based on the decoded command signals. The command decoder 230 may activate the active command ACT when a combination of the inputted command signals indicates the active command ACT. Furthermore, the command decoder 230 may activate the precharge command PRE when a combination of the inputted command signals indicates the precharge command PRE. In addition, the command decoder 230 may decode the inputted command signals and generate a read or write command. However, since this operation has no direct relation to the memory device in accordance with the embodiment of the present invention, illustrations and descriptions thereof are omitted herein.

The word line control unit 240 may detect a frequently activated word line HWL, and replace the frequently activated word line HWL with the redundant word line RWL. When the frequently activated word line HWL is replaced with the redundant word line RWL, it may indicate that the redundant word line RWL is accessed instead of the frequently activated word line HWL when the input address IADD corresponds to the frequently activated word line HWL. The access may indicate an active, read, write, refresh, or precharge operation which is performed on the corresponding word line. FIG. 2 illustrates the case in which a Kth normal word line WLK is the frequently activated word line HWL, and the frequently activated word line HWL is replaced with the redundant word line RWL.

The word line control unit 240 may activate a word line corresponding to the input address IADD among the normal word lines WL0 to WLN in response to the active command ACT, and precharge the activated word line in response to the precharge command PRE. When the frequently activated word line HWL is detected, the word line control unit 240 may store the address of the frequently activated word line HWL, and copy data of memory cells (not illustrated in FIG. 2) coupled to the frequently activated word line HWL into memory cells (not illustrated in FIG. 2) coupled to the redundant word line RWL. Hereafter, the copying operation is referred to as a word line copying operation. Then, when the active command ACT is inputted, the word line control unit 240 may activate the redundant word line RWL instead of the word line corresponding to the input address IADD when the input address IADD corresponds to the stored address of the frequently activated word line HWL.

The redundant word line RWL may have higher immunity to word line disturbance than the normal word lines WL0 to WLN. When a certain word line has relatively strong immunity to the word line disturbance, it may indicate that data of memory cells coupled to word lines adjacent to the corresponding word line are unlikely to be degraded, even though the word line is frequently activated-precharged. A method for allowing the redundant word line WL to have higher immunity to the word line disturbance will be described below with reference to FIGS. 4 to 6.

For this operation, the word line control unit 240 may include a detector 241, a comparator 242, and a word line controller 243. The detector 241 may detect a frequently activated word line HWL by using the active command ACT and the input address IADD. The detector 241 may activate a detection sign DET when the frequently activated word line HWL is detected, The frequently activated word line may indicate a word line of which the number of activations is equal to or more than a preset reference number during a preset period, or the active frequency is equal to or more than a preset reference frequency. That is, the frequently activated word line may include a word line which is activated a greater number of times than the preset reference number, or activated more frequently than the preset reference frequency.

The detector 241 may receive the active command ACT and the input address IADD, count how many times each of the normal word lines WL0 to WLN is activated during the preset period, and detect a normal word line of which the number of activations is equal to or more than the reference number, among the normal word lines WL0 to WLN, as a frequently activated word line HWL. Furthermore, the detector 241 may store an active history during the preset period, and detect a normal word line of which the active frequency is equal to or more than the reference frequency, among the normal word lines WL0 to WLN, as the frequently activated word line HWL. The active history may include data obtained by sequentially storing which normal word lines were activated during the preset period. The detector 241 may determine the normal word line, detected through one or more of the two above-described methods, as the frequently activated word line HWL. For reference, the reference number and the reference frequency may be set to the extent to which a memory cell may encounter word line disturbance.

For example, when the reference number is set to 10^5 the detector 241 may detect a normal word line, which is activated 10^5 or more times during the preset period, as a frequently activated word line HWL. Alternatively, when the reference frequency is set to two or more times per every five active operations of the memory device, the detector 241 may detect a normal word line, which is activated two or more times per every five active operations of the memory device during the preset period, as a frequently activated word line HWL.

For reference, the preset period may be set to correspond to a specific time by using a timer. Alternatively, the active command ACT and a refresh command may be counted by using a counter to set preset numbers corresponding to the reference frequency.

When the frequently activated word line HWL is detected, the comparator 242 may store an input address IADD corresponding to the address of the frequently activated word line HWL. Then, the comparator 242 may compare the input address IADD currently inputted with the stored address, and activate a replacement signal RE when the currently inputted input address IADD is identical to the stored address. When the detection signal DET is activated, the comparator 242 may store the input address IADD. After the corresponding address is stored, the comparator 242 compares the input address IADD with the stored address in response to the active command ACT, and activates the replacement signal RE when the input address IADD are identical to the stored address. When the memory device is reset, that is, when a reset signal RST is activated, the comparator 242 may remove the stored address. Then, the comparator 242 may be reset.

The word line controller 243 may activate a word line corresponding to the input address IADD in response to the active command ACT, and precharge the activated word line in response to the precharge command PRE. However, when the active command ACT is inputted and the replacement signal RE is activated, the word line controller 243 may activate the redundant word line RWL instead of the word line corresponding to the input address IADD.

When the detection signal DET is activated, the word line controller 243 may activate the word line corresponding to the input address IADD, that is, the frequently activated word line HWL, and then activate the redundant word line RWL when the frequently activated word line HWL is activated.

When the frequently activated word line HWL is activated, data of memory cells coupled to the frequently activated word line HWL may be transmitted to corresponding bit lines (not illustrated in FIG. 2), and then amplified by bit line sense amplifiers (not illustrated in FIG. 2). Thus, the bit lines may be driven to voltages corresponding to the data of the respective memory cells. At this time, when the redundant word line RWL sharing the bit line sense amplifiers with the normal word lines WL0 to WLN is activated, the data of the bit lines may be written to memory cells coupled to the redundant word lime RWL. Although the normal word line is replaced with the redundant word line through a word line copying operation while the memory device is operated, the operation may be performed without loss of the data stored in the memory cells coupled to the replaced normal word line. The word line copying operation will be described below in detail with reference to FIGS. 3A and 3B.

When a frequently activated word line HWL is detected while the memory device performs a large number of active-precharge operations, the word line control unit 240 may copy data of the frequently activated word line HWL into the redundant word line RWL. Then, when the active command ACT and an address IADD corresponding to the frequently activated word line HWL are inputted to the memory device, the word line control unit 240 may activate the redundant word line WRL instead of the frequently activated word line HWL. When the memory device is reset, a frequently activated word line HWL may be newly detected or replaced.

The memory device may replace a frequently activated word line with a redundant word line, and copy data of the frequently activated word line into the redundant word line. Thus, the memory device may reduce data loss caused by the word line disturbance and may reduce errors, thereby improving the reliability thereof.

Figure 3A:
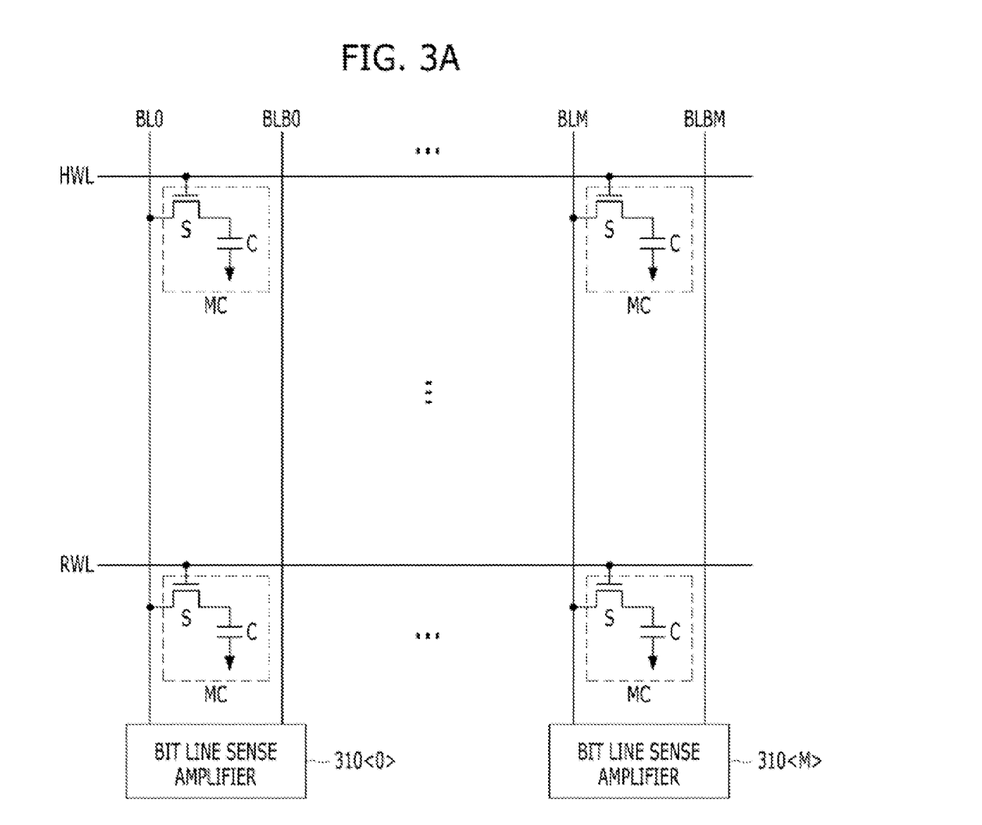
FIGS. 3A and 3B are diagrams for describing a word line copying operation of the memory device shown in FIG. 2.
Figure 3B:
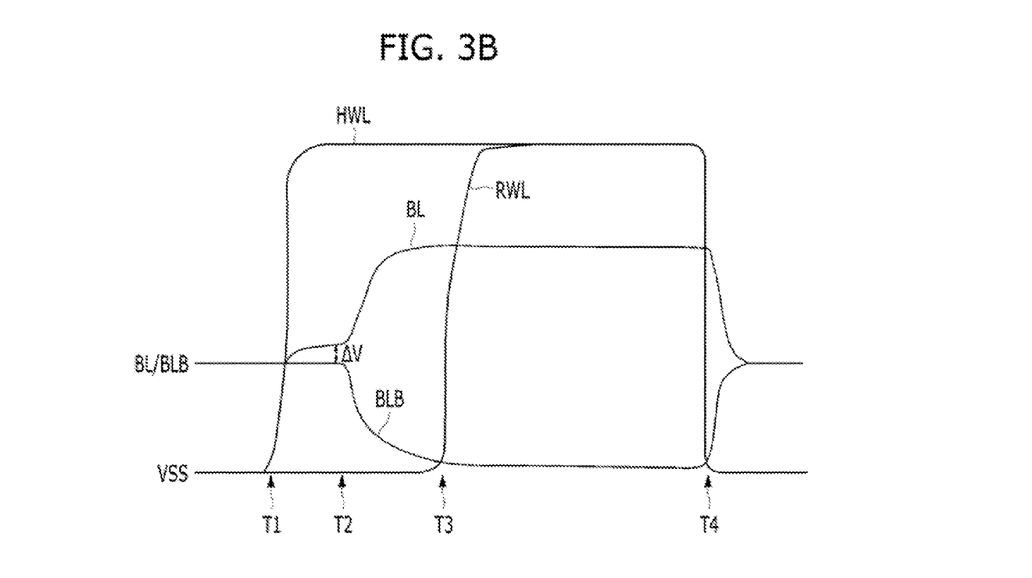

FIGS. 3A and 3B are diagrams for describing the word line copying operation of the memory device shown in FIG. 2.

FIG. 3A illustrates a frequently activated word line HWL corresponding to a Kth word line WKL of FIG. 2, a redundant word line RWL, a plurality of bit line pairs BL0/BLB0 to BLM/BLBM, and a plurality of bit line sense amplifiers 310<0> to 310<M> corresponding to the respective bit line pairs BL0/BLB0 to BLM/BLBM. Each of the frequently activated word line HWL and the redundant word line RWL may be coupled to a plurality of memory cells MCs. Each of the memory cells MCs may include a switching or selecting element S and a cell capacitor C.

FIG. 3B illustrates the waveforms of signals required for describing the word line copying operation. In FIG. 3B, HWL represents a waveform indicating the state of the frequently activated word line HWL, RWL represents a waveform indicating the state of the redundant word line RWL, BL represents a waveform indicating the state of a bit line BL, for example one among BL0 to BLM, and BLB represents a waveform indicating the state of a complementary bit line BLB, for example, one among BLB0 to BLBM. FIG. 3B illustrates the case in which high data is stored in a memory cell MC coupled to the frequently activated word line HWL, First, when the frequently activated word line HWL is activated at a first time point T1, minute potential differences ΔV occur in the respective bit line pairs BL0/BLB0 to BLM/BLBM due to electric charges stored in the cell capacitors C of memory cells MCs coupled to the frequently activated word line HWL.

When the bit line sense amplifiers 310<0> to 310<M> are activated at a second time point T2, the bit line sense amplifiers 310<0> to 310<M> may amplify the minute potential differences ΔV of the corresponding bit line pairs BL0/BLB0 to BLM/BLBM. Then, the voltage of a bit line BL, may be driven to a voltage VH corresponding to high data, and the voltage of a complementary bit line BLB may be driven to a voltage VSS corresponding to low data.

At a third time point T3, the redundant word line RWL may be activated in a state in which the frequently activated word line HWL is activated. When the redundant word line RWL is activated, the data loaded in the bit line pairs BL0/BLB0 to BLM/BLBM may be written to the memory cells MCs coupled to the redundant word line RWL.

When the word line copying operation is completed, the frequently activated word line HWL and the redundant word line RWL may be precharged to the level of the ground voltage VSS at a fourth time point T4.

Figure 4:
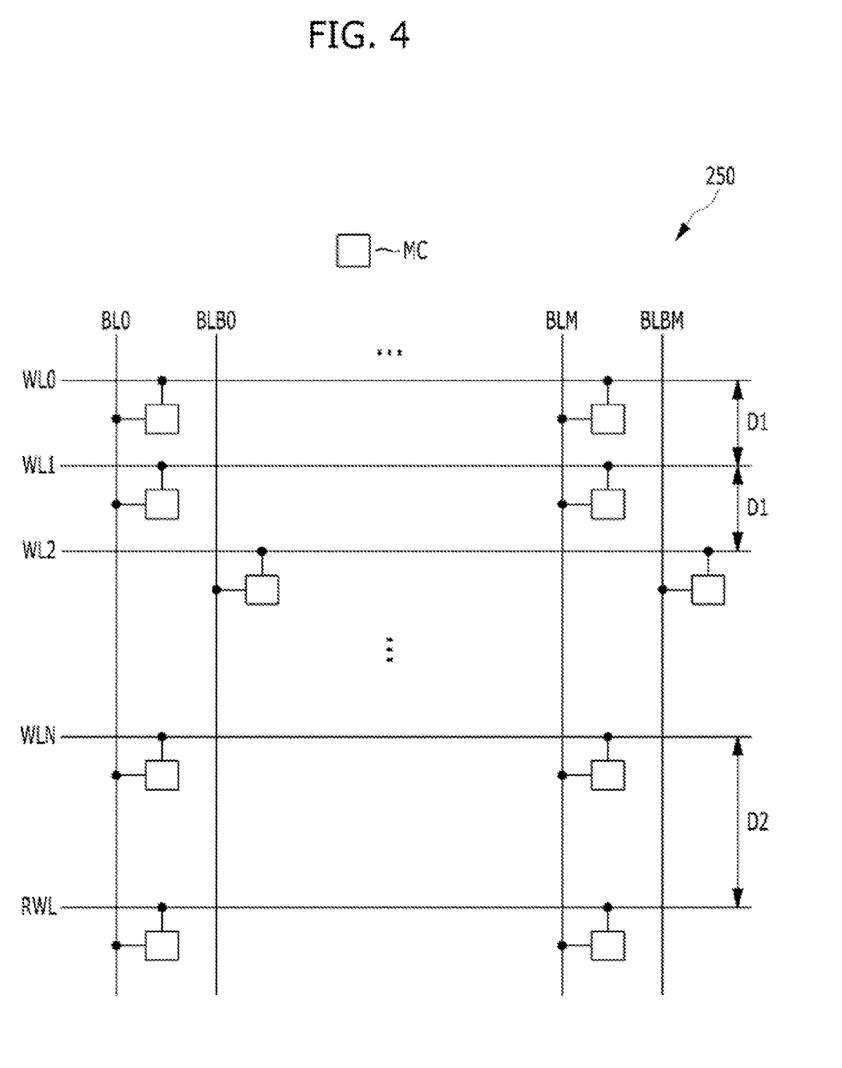
FIG. 4 is a diagram of a cell array shown in FIG. 2.

FIG. 4 is a diagram of the cell array 250 shown in FIG. 2,

Referring to FIG. 4, the cell array 250 may include a plurality of normal word lines WL0 to WLN and a redundant word line RWL. The normal word lines WL0 to WLN and the redundant word line RWL may correspond to each of the same bit line pairs BL0/BLB0 to BLM/BLBM. Each of the normal word lines WL0 to WLN and the redundant word line RAIL may be coupled to a plurality of memory cells MCs.

The normal word lines WL0 to WLN may be arranged at a first distance D1 from each other, and the redundant word One RWL may be arranged between the normal word lines WL0 to WLN or arranged next to the word One WLN disposed at the outermost position among the normal word lines WL0 to WLN. FIG. 4 illustrates the latter case. The redundant word line RWL may be separated at a second distance D2, which is greater than the first distance D1, from the normal word line WLN disposed adjacent thereto. The second distance D2 may be set to such a distance that data of memory cells MCs coupled to the redundant word line RWL are not affected by active-precharge operations of the redundant word line RWL.

The word line disturbance occurs as the distance between word lines shrinks due to the miniaturization of the semiconductor process. Thus, the normal word lines WL0 to WLN may be arranged at the distance D1, which is generally used, and the redundant word line RWL may be arranged at the second distance D2 from the adjacent word line WLN. Then, while the area of the cell array 250 is minimized, the redundant word line RWL may be designed to have higher immunity to the word One disturbance.

Referring to FIG. 4, it has been described that the cell array 250 includes one redundant word line RWL and the word line WLN arranged adjacent to the redundant word line RWL is the normal word line WLN disposed at the outermost position among the normal word lines WL0 to WLN. Depending on design, however, the position and number of the word line RWL may be changed.

For example, the cell array 250 may include two or more redundant word lines, and the redundant word lines may replace different normal word lines, respectively. Each of the redundant word lines may be arranged at the second distance D2 from a normal word line or redundant word line adjacent thereto. Furthermore, the redundant word line RWL may be arranged between word lines WLX and WLX+1 where X is an integer less than N. At this time, the distance between the redundant word line RWL and the normal word lines WLX and WLX+1 adjacent to the redundant word line RWL may be set to the second distance D2.

Figure 5:
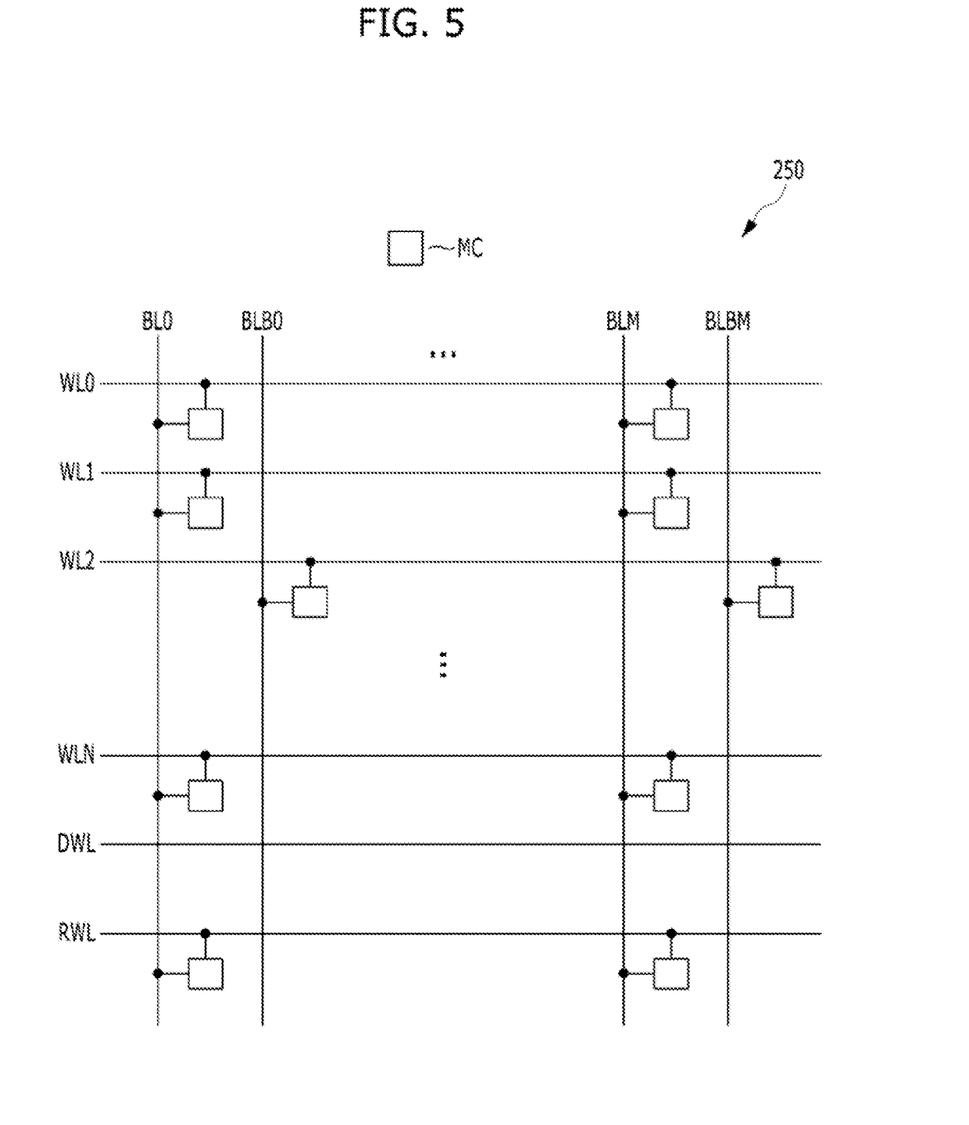
FIG. 5 is a diagram of a cell array shown in FIG. 2.

FIG. 5 is a diagram of the cell array 250 shown in FIG. 2.

Referring to FIG. 5, the cell array 250 may include normal word lines WL0 to WLN, a redundant word line RWL, and a dummy word line DWL. The normal word lines WL0 to WLN and the redundant word line RWL may correspond to each of the same bit line pairs BL0/BLB0 to BLM/BLBM. Each of the normal word lines WL0 to WLN and the redundant word line RWL may be coupled to a plurality of memory cells MCs.

The normal word lines WL0 to WLN may be sequentially arranged, and the redundant word line RWL may be arranged between the normal word lines WL0 to WLN or at the outermost position of the normal word lines WL0 to WLN. FIG. 5 illustrates the latter case. The dummy word line OWL may be arranged between the redundant word line RWL and the word line WLN adjacent to the redundant word line RWL among the normal word lines WL0 to WLN. The dummy word line DWL is an unused word line, and may be arranged between the redundant word line RWL and the word line WLN adjacent to the redundant word line RWL such that active-precharge operations of the adjacent word line WLN have no influence on memory cells MCs coupled to the redundant word line RWL. The word line adjacent to the redundant word line RWL may indicate the word line arranged closest to the redundant word line, except for the dummy word line DWL.

As described above, the word line disturbance occurs as the distance between word lines shrinks due to the miniaturization of the semiconductor process. Thus, as the dummy word line DWL is arranged between the redundant word line RWL and the word line WLN adjacent to the redundant word line RWL, the distance between the redundant word line WLN and the adjacent word line WLN may be increased, and the influence of the active-precharge operations of the adjacent word line WLN may be blocked. Through such a method, the redundant word line RWL may be designed to have higher immunity to the word line disturbance, while the area of the cell array 250 is minimized.

Referring to FIG. 5, it has been described that the cell array 250 includes one redundant word line RWL and the word line WLN arranged adjacent to the redundant word line RWL is the normal word line WLN disposed at the outermost position among the normal word lines WL0 to WLN. Depending on design, however, the position and number of the redundant word line RWL may be changed.

For example, the cell array 250 may include two or more redundant word lines, and the redundant word lines may replace different normal word lines, respectively. At this time, a dummy word line may be arranged between each of the redundant word lines and a normal word line or redundant word line disposed adjacent to the redundant word line. Furthermore, the redundant word line RWL may be arranged between word lines WLX and WLX+1 where X is an integer less than N. A dummy word line may be arranged between the redundant word line RWL and the normal word lines adjacent to the redundant word line RWL, that is, between the normal word line WLX and the redundant word line RWL and between the normal word line WLX+1 and the redundant word line RWL.

Figure 6:
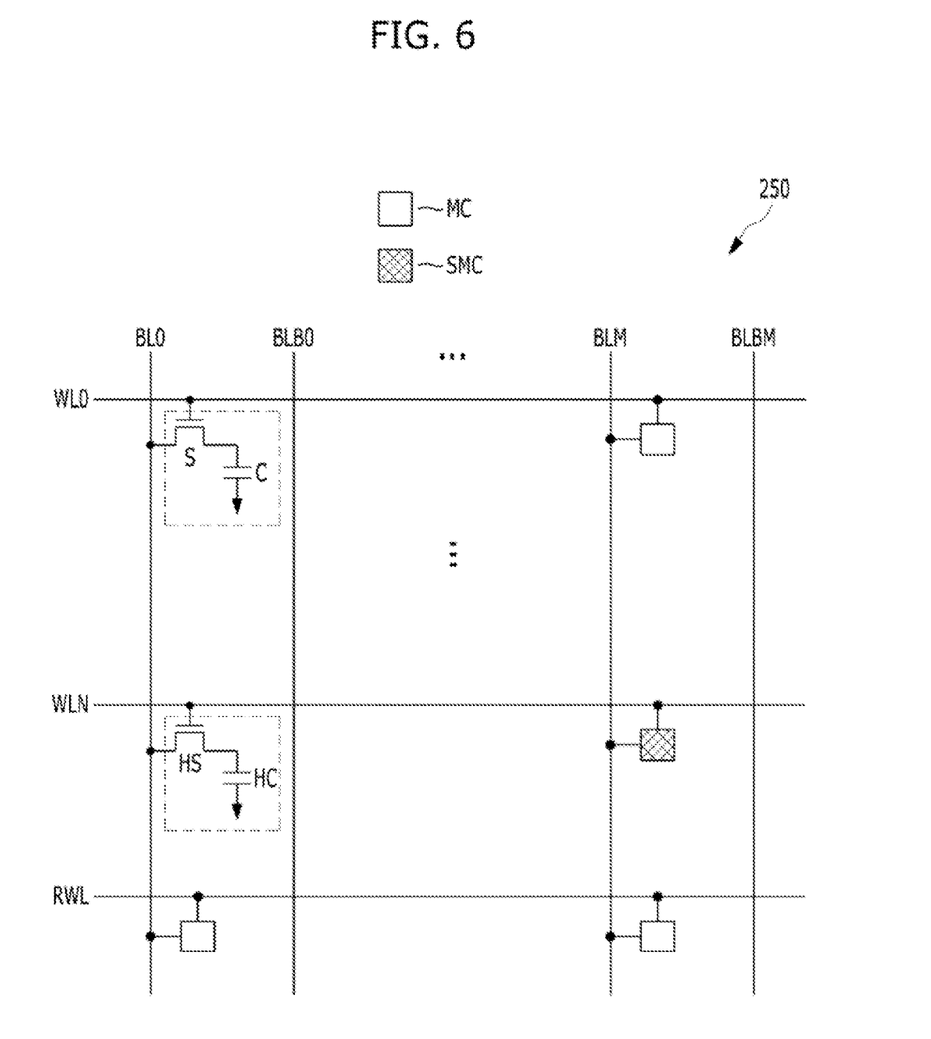
FIG. 6 is a diagram of a cell array shown in FIG. 2.

FIG. 6 is a diagram of the cell array 250 shown in FIG. 2.

Referring to FIG. 6, the cell array 250 may include a plurality of normal word lines WL0 to WLN and a redundant word line RWL. The normal word lines WL0 to WLN and the redundant word line RWL may correspond to each of the same bit line pairs BL0/BLB0 to BLM/BLMB. Each of the normal word lines WL0 to WLN and the redundant word line RWL may be coupled to a plurality of memory cells MCs or SMCs.

The normal word lines WL0 to WLN may be sequentially arranged, and the redundant word line RWL may be arranged between the normal word lines WL0 to WLN or next to the outermost normal word line WLN. FIG. 6 illustrates the latter case. The memory cells SMCs coupled to the word line WLN adjacent to the redundant word line RWL may be designed to have a longer retention time than the other memory cells MCs. Each of the memory cells MCs or SMCs may include a cell transistor S or HS and a cell capacitor C or HC.

The retention time may be referred to as a data retention time, and indicate the time during which data of a memory cell is retained after the data is stored in the memory cell. When a certain memory cell has a long retention time, it may indicate that the corresponding memory cell retains data for a long time and reliably endures external influence, for example, word line disturbance. Thus, when the retention time of the memory cells SMCs coupled to the word line WLN adjacent to the redundant word line RWL, is longer than the retention time of the memory cells MCs coupled to the other word lines data stored in the memory cells SMCs coupled to the adjacent word line WLN are rarely lost, even though the redundant word line RWL is frequently activated-precharged. Thus, the redundant word line RWL may have higher immunity to word line disturbance.

A memory cell may store data in the form of electric charge in a cell capacitor. When the electric charge stored in the cell capacitor is lost due to leakage current of a cell transistor, the stored data may be lost. Thus, when the threshold voltage of the cell transistor which may include a switch, MOSFET, or transistor is increased to reduce the leakage current or the capacitance of the cell capacitor is increased to retain electric charge for a long time even though leakage current occurs, the retention time of the memory cell may be increased. To increase the retention time of the memory cell SMC, the threshold voltage of the cell transistor HS included in the memory cell SMC may be set higher than that of the cell transistors S of the other memory cells MCs. Alternatively, to increase the retention time of the memory cell SMC, the capacitance of the cell capacitor HC included in the memory cell SMC may be set greater than that of the cell capacitors C of the other memory cells MCs.

FIG. 6 illustrates that the memory cell SMC includes the cell transistor HS having a high threshold voltage and the cell capacitor HC having large capacitance. However, the memory cell SMC may include only one of the two. That is, the memory cell SMC may include the cell transistor HS and a general cell capacitor C or include a general cell transistor S and the cell capacitor HC.

Referring to FIG. 6, the cell array 250 includes one redundant word line RWL and a word line WLN arranged adjacent to the redundant word line RWL which is the normal word line WLN disposed at the outermost position among the normal word lines WL0 to WLN. However, depending on design, the position and umber of the redundant word line RWL may be changed.

For example, the cell array 250 may include two or more redundant word lines, and the redundant word lines may replace different normal word lines, respectively. Memory cells SCM coupled to a redundant word line or normal word line disposed adjacent to each of the redundant word lines may have a longer retention time than the other memory cells MCs. Furthermore, the redundant word line RWL may be arranged between word lines WLX and WLX+1 where X is an integer less than N. The memory cells SMCs coupled to the normal word lines WLX and WLX+1 adjacent to the redundant word line RWL may have a longer retention time than the other memory cells MCs.

Figure 7:
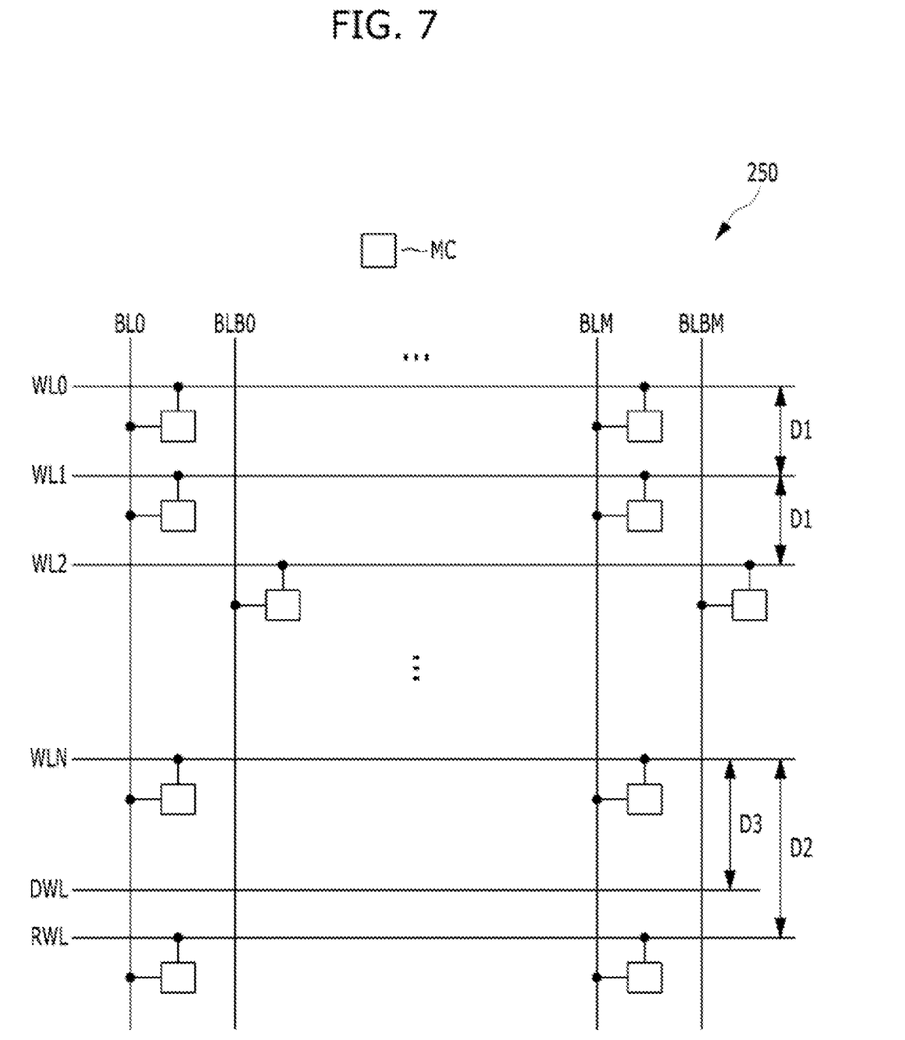
FIG. 7 is a diagram of a cell array shown in FIG. 2.

FIG. 7 is a diagram of the cell array 250 shown in FIG. 2.

Referring to FIG. 7, the cell array 250 may include a plurality of normal word lines WL0 to WLN a dummy word line DWL, and a redundant word line RWL. The normal word lines WL0 to WLN and the redundant word line RWL may correspond to each of the same bit line pairs BL0/BLB0 to BLM/BLBM. Each of the normal word lines WL0 to WLN and the redundant word line RWL may be coupled to a plurality of memory cells MCs.

The normal word lines WL0 to WLN may be arranged at a first distance D1 from each other, and the redundant word line RWL may be arranged between the normal word lines WL0 to WLN or next to the word line WLN disposed at the outermost position among the normal word lines WL0 to WLN. FIG. 7 illustrates the latter case. The redundant word line RWL may be arranged at a second distance D2, which is greater than the first distance D1, from the normal word line WLN arranged adjacent thereto. Furthermore, between the redundant word line RWL and the normal word line WLN adjacent to the redundant word line RWL, a dummy word line DWL may be arranged. The distance between the dummy word line DWL and the adjacent normal word line WLN may be set to a third distance D3, which is greater than the first distance D1.

The cell array 250 of FIG. 7 may allow the redundant word line RWL to have higher immunity to the word line disturbance through a combination of the methods illustrated in FIGS. 4 and 5.

Referring to FIG. 7, the cell array 250 may include one redundant word line RWL and the word line WLN arranged adjacent to the redundant word line RWL which is the normal word line WLN disposed at the outermost position among the normal word lines WL0 to WLN. However, depending on design, the position and number of the redundant word line RWL may be changed.

Figure 8:
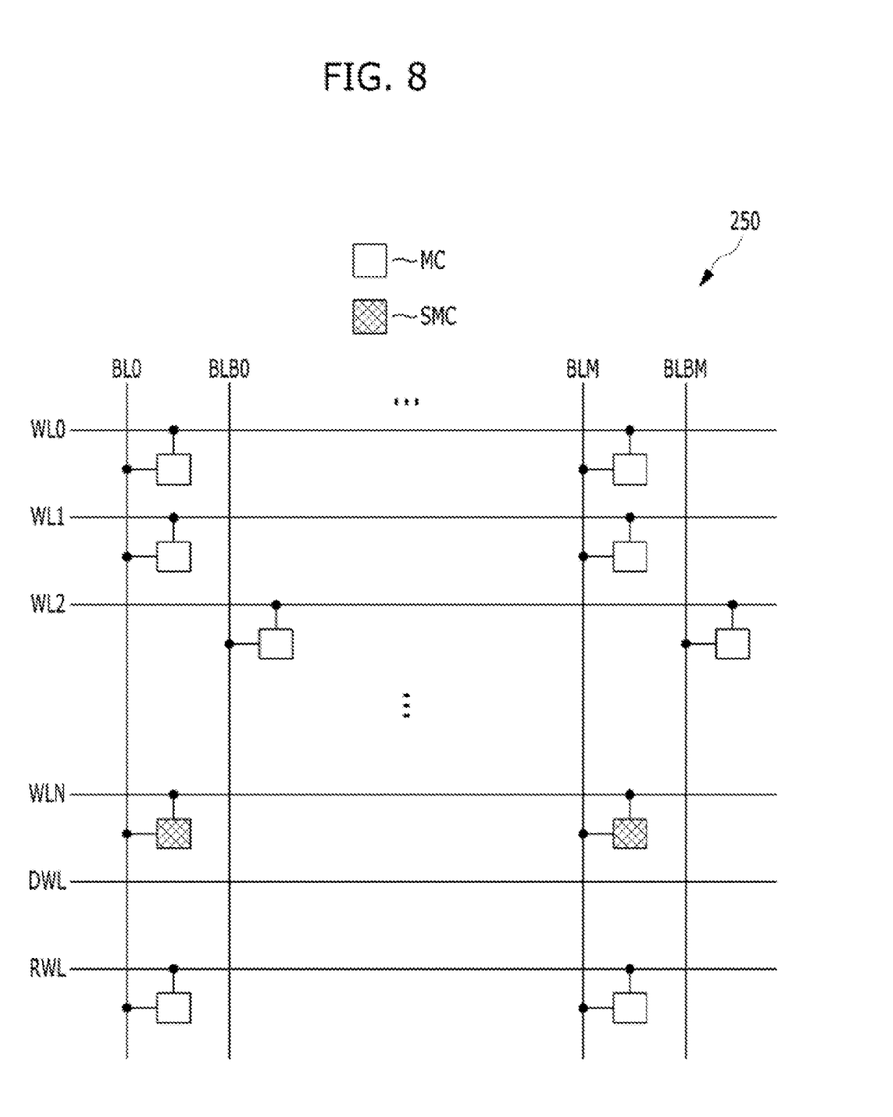
FIG. 8 is a diagram of a cell array shown in FIG. 2.

FIG. 8 is a diagram of the cell array 250 shown in FIG. 2.

The cell array 250 of FIG. 8 may include a plurality of normal word lines WL0 to WLN, a dummy word line DWL, and a redundant word line RWL. The normal word lines WL0 to WLN and the redundant word line RWL may correspond to each of the same bit line pairs BL0 BLB0 to BLM/BLBM. Each of the normal word lines WL0 to WLN and the redundant word line RWL may be coupled to a plurality of memory cells MCs or SMCs.

The normal word lines WL0 to WLN may be sequentially arranged, and the redundant word line RWL may be arranged between the normal word lines WL0 to WLN or at the outermost position of the normal word lines WL0 to WLN. FIG. 8 illustrates the latter case. The dummy word line DWL may be arranged between the redundant word line RWL and the word line WLN adjacent to the redundant word line RWL among the normal word lines WL0 to WLN. The memory cells MCs coupled to the word line WLN adjacent to the redundant word line RWL may be designed to have a longer retention time than the other memory cells MCs.

The cell array 250 of FIG. 8 may allow the redundant word line RWL to have higher immunity to the word line disturbance through a combination of the methods illustrated in FIGS. 5 and 6.

Referring to FIG. 8, the cell array 250 includes one redundant word line RWL and the word line WLN arranged adjacent to the redundant word line is the normal word line WLN disposed at the outermost position among the normal word lines WL0 to WLN. However, depending on design, the position and number of the redundant word line RWL may be changed.

Figure 9:
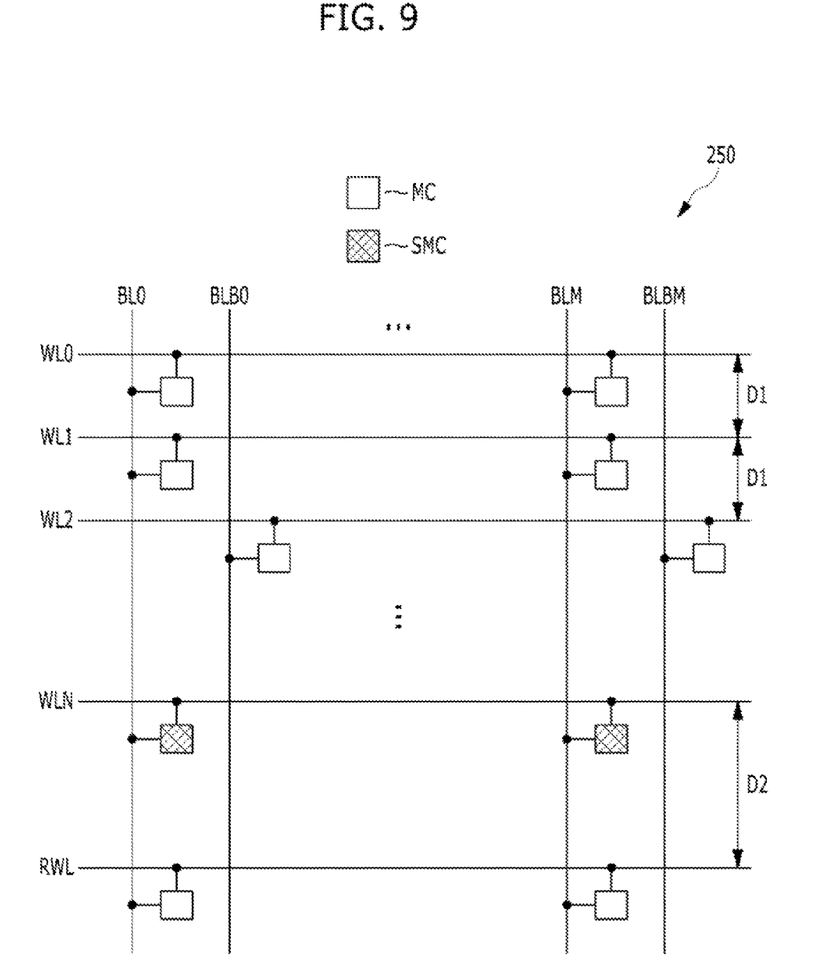
FIG. 9 is a diagram of a cell array shown in FIG. 2.

FIG. 9 is a diagram of the cell array 250 shown in FIG. 2.

Referring to FIG. 9, the cell array 250 may include a plurality of normal word lines WL0 to WLN, a dummy word line DWL, and a redundant word line RWL. The normal word lines WL0 to WLN and the redundant word line RWL may correspond to each of the same bit line pairs BL0/BLB0 to BLM/BLBM. Each of the normal word lines WL0 to WLN and the redundant word line RWL may be coupled to a plurality of memory cells MCs.

The normal word lines WL0 to WLN may be arranged at a first distance D1 from each other, and the redundant word line RWL may be arranged between the normal word lines WL0 to WLN or next to the word line WLN disposed at the outermost position among the normal word lines WL0 to WLN. FIG. 9 illustrates the latter case. The redundant word line RWL may be arranged at a second distance D2, which is greater than the first distance D1, from the normal word line WLN disposed adjacent to the redundant word line RWL. The memory cells SMCs coupled to the word line WLN adjacent to the redundant word line RWL may be designed to have a longer retention time than the other memory cells MCs.

The cell array 250 of FIG. 9 may allow the redundant word line RWL to have higher immunity to word line disturbance through a combination of the methods illustrated in FIGS. 4 and 6.

Referring to FIG. 9, it has been described that the cell array 250 includes one redundant word line RWL and the word line WLN arranged adjacent to the redundant word line RWL which is the normal word line WLN disposed at the outermost position among the normal word lines WL0 to WLN. However, depending on design, the position and number of the redundant word line RWL may be changed.

In addition, the cell array 250 may be designed through a combination of the methods illustrated in FIGS. 2 to 4. That is, the dummy word line DWL may be arranged between the redundant word line RWL and the normal word line WLN adjacent to the redundant word line RWL, the distance between the dummy word line DWL and the normal word line WLN adjacent to the dummy word line DWL may be set to be greater than the distance between the normal word lines, and the memory cells MCs coupled to the adjacent normal word line WLN may be designed to have a longer retention time than the memory cells MCs coupled to the other normal word lines.

Figure 10:
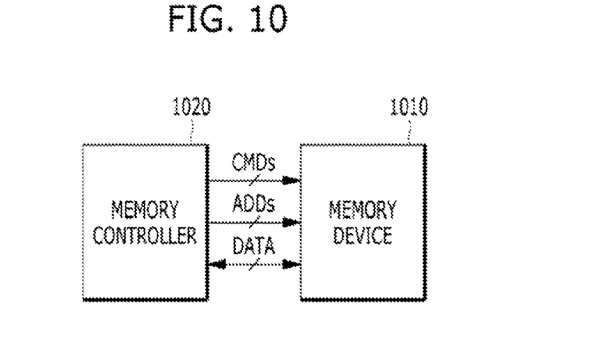
FIG. 10 is a diagram of a memory system in accordance with an embodiment of the present invention.

FIG. 10 is a diagram illustrating a memory system in accordance with an embodiment of the present invention.

As illustrated in FIG. 10, the memory system may include a memory device 1010 and a memory controller 1020.

The memory controller 1020 may control the operation of the memory device 1010 by applying commands CMDs and addresses ADDs to the memory device 1010, and exchange data DATA with the memory device 1010 during a read or write operation. The memory controller 1020 may transmit command signals CMDs to input an active command ACT, a precharge command PRE or the like to the memory device 1010. When inputting the active command ACT, the memory controller 1020 may transmit addresses ADDS for selecting a cell block and a word line to be activated in the memory device 1010.

The memory device 1010 is the memory device of FIG. 2, and may include the cell array 250 configured as described with reference to FIGS. 4 to 9. When a frequently activated word line HWL is detected, the memory device 1010 may copy data of memory cells MCs coupled to the frequently activated word line HWL into memory cells MCs coupled to a redundant word line RWL. Then, when an access request for the frequently activated word line HWL is inputted, the redundant word line RWL may be accessed instead of the frequently activated word line HWL. For reference, the configuration of the memory device 1010 for performing the word line copying and replacing operations may be set in the same manner as described with reference to FIGS. 2 to 4.

The memory system may copy the data of the frequently activated word line into the redundant word line, and replace the frequently activated word line with the redundant word line, thereby preventing a problem caused by word line disturbance.

In accordance with the embodiments of the present invention, the memory device may replace a frequently activated word line with a word line having higher immunity to the word line disturbance, thereby preventing data of memory cells from being damaged by the word line disturbance.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a plurality of normal word lines arranged at a first distance from each other;
   a redundant word line arranged at a second distance, which is greater than the first distance, from a normal word line adjacent to the redundant word line, among the normal word lines;
   a dummy word line arranged between the redundant word line and the normal word line adjacent to the redundant word line; and
   a word line control unit suitable for selectively activating the normal word lines, and replacing a frequently activated word line with the redundant word line when the frequently activated word line is detected among the normal word lines,
   wherein the distance between the normal word line adjacent to the redundant word line and the dummy word line is greater than the first distance.

2. The memory device of claim 1, wherein the frequently activated word line comprises a normal word line of which the number of activations is equal to or more than a reference number or the active frequency is equal to or more than a reference frequency, among the normal word lines.

3. The memory device of claim 1, wherein the frequently activated word line and the redundant word line correspond to the same bit lines.

4. The memory device of claim 1, wherein the word line control unit copies data of memory cells coupled to the frequently activated word line into memory cells coupled to the redundant word line.

5. The memory device of claim 4, wherein when the data of the memory cells coupled to the frequently activated word line are copied into the memory cells coupled to the redundant word line, the word line control unit activates the redundant word line when the frequently activated word line is activated.

6. The memory device of claim 1, wherein when an address corresponding to the frequently activated word line is inputted after the frequently activated word line is replaced with the redundant word line, the word line control unit accesses the redundant word line instead of the frequently activated word line.

7. The memory device of claim 1, wherein the word line control unit comprises:
- a detector suitable for detecting the frequently activated word line;
- a comparator suitable for storing an address of the frequently activated word line when the frequently activated word line is detected, and comparing a currently inputted address with the stored address; and
- a word line controller suitable for activating a word line corresponding to the currently inputted address based on an active command, and activating the redundant word line when the frequently activated word line is activated and the frequently activated word line is detected.

8. The memory device of claim 7, wherein the word line controller accesses the redundant word line instead of a word line corresponding to the currently inputted address when the currently inputted address is identical to the address stored in the comparator.

9. The memory device of claim 1, wherein memory cells coupled to the normal word line adjacent to the redundant word line have a longer retention time than memory cells coupled to a normal word line which is not adjacent to the redundant word line.

10. A memory device comprising:
- a plurality of normal word lines;
- a redundant word line;
- a dummy word line arranged between the redundant word line and a normal word line adjacent to the redundant word line, among the normal word lines; and
- a word line control unit suitable for selectively activating the normal word lines, and replacing a frequently activated word line with the redundant word line, when the frequently activated word line is detected among the normal word lines,
wherein memory cells coupled to the normal word line adjacent to the redundant word line have a longer retention time than memory cells coupled to a normal word line which is not adjacent to the redundant word line.

11. The memory device of claim 10, wherein the frequently activated word line comprises a normal word line of which the number of activations is equal to or more than a reference number or the active frequency is equal to or more than a reference frequency, among the normal word lines.

12. The memory device of claim 10, wherein the frequently activated word line and the redundant word line correspond to the same bit lines.

13. The memory device of claim 10, wherein the word line control unit copies data of memory cells coupled to the frequently activated word line into memory cells coupled to the redundant word line.

14. The memory device of claim 13, wherein when the data of the memory cells coupled to the frequently activated word line are copied into the memory cells coupled to the redundant word line, the word line control unit activates the redundant word line when the frequently activated word line is activated.

15. The memory device of claim 10, wherein when an address corresponding to the frequently activated word line is inputted after the frequently activated word line is replaced with the redundant word line, the word line control unit accesses the redundant word line instead of the frequently activated word line.

16. A memory device comprising:
- a plurality of normal word lines;
- a redundant word line; and
- a word line control unit suitable for selectively activating the normal word lines, and replacing a frequently activated word line with the redundant word line when the frequently activated word line is detected among the normal word lines,
wherein memory cells coupled to a normal word line adjacent to the redundant word line, among the normal word lines, have a longer retention time than memory cells coupled to a normal word line which is not adjacent to the redundant word line.

17. The memory device of claim 16, wherein the frequently activated word line comprises a normal word line of which the number of activations is equal to or more than a reference number or the active frequency is equal to or more than a reference frequency, among the normal word lines.

18. The memory device of claim 16, wherein the memory cell comprises:
- a switching transistor coupled to a corresponding word line; and
- a cell capacitor coupled to the switching transistor, and
wherein the switching transistor of a memory cell coupled to the normal word line adjacent to the redundant word line has a higher threshold voltage than the switching transistor of a memory cell coupled to a normal word line which is not adjacent to the redundant word line.

19. The memory device of claim 16, wherein the memory cell comprises:
- a switching transistor coupled to a corresponding word line; and
- a cell capacitor coupled to the switching transistor, wherein the cell capacitor of a memory cell coupled to the normal word line adjacent to the redundant word line has a greater capacitance than the cell capacitor of a memory cell coupled to a normal word line which is not adjacent to the redundant word line.

20. The memory device of claim 16, wherein the frequently activated word line and the redundant word line correspond to the same bit lines.

21. The memory device of claim 16, wherein the word line control unit copies data of memory cells coupled to the frequently activated word line into memory cells coupled to the redundant word line.

22. The memory device of claim 16, wherein when data of memory cells coupled to the frequently activated word line are copied into memory cells coupled to the redundant word line, the word line control unit activates the redundant word line when the frequently activated word line is activated.

23. The memory device of claim 16, wherein when an address corresponding to the frequently activated word line is inputted after the frequently activated word line is replaced with the redundant word line, the word line control unit accesses the redundant word line instead of the frequently activated word line.

* * * * *